United States Patent
Lee et al.

(10) Patent No.: US 7,460,391 B2
(45) Date of Patent: Dec. 2, 2008

(54) WRITE VCCMIN IMPROVEMENT SCHEME

(75) Inventors: Cheng Hung Lee, Hsinchu (TW);
Hung-Jen Liao, Hsin-Chu (TW);
Kun-Lung Chen, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 139 days.

(21) Appl. No.: 11/654,983

(22) Filed: Jan. 18, 2007

(65) Prior Publication Data

US 2008/0175077 A1    Jul. 24, 2008

(51) Int. Cl.
*G11C 7/00*    (2006.01)
(52) U.S. Cl. .................... 365/154; 365/204
(58) Field of Classification Search ............ 365/154, 365/204, 189.16
See application file for complete search history.

(56) References Cited

U.S. PATENT DOCUMENTS

| 5,757,702 | A  | * | 5/1998 | Iwata et al. ............ 365/189.05 |
| 6,791,895 | B2 | * | 9/2004 | Higeta et al. ................ 365/226 |
| 7,397,693 | B2 | * | 7/2008 | Yamaoka et al. ............ 365/154 |

* cited by examiner

*Primary Examiner*—Vu A Le
(74) *Attorney, Agent, or Firm*—K & L Gates LLP

(57) ABSTRACT

A semiconductor memory is disclosed, which comprises a plurality of memory cells, at least one high voltage power supply (CVDD) line coupled to the plurality of memory cells for supplying power to the same, and at least one controllable discharging circuit coupled between the CVDD line and a complementary low voltage power supply (ground), wherein only during a write operation the controllable discharging circuit is turned on for discharging the CVDD line.

20 Claims, 3 Drawing Sheets

WRITE VCCMIN IMPROVEMENT SCHEME

BACKGROUND

The present invention relates generally to integrated circuit designs and more particularly to write circuit design for improving write margins in static random access memory (SRAM).

SRAM is typically used for storing data needed to be speed accessed by processing units. A conventional 6-T SRAM cell comprises two cross-coupled inverters forming a data latch and two pass-gate NMOS transistors for controlling accesses to the data latch by a bit-line-true (BLT) and a bit-line-complementary (BLC). During a read operation, the data latch drives the BLT or BLC to develop a differential voltage between the BLT and BLC, therefore a higher supply voltage provides a greater read margin. During a write operation, it is the BLT or BLC that forces the data latch to flip, therefore, given a fixed BLT and BLC voltage level, a lower supply voltage provides a greater write margin.

There have been many attempts to increase write margins in the SRAM, such as floating a column of SRAM cells that is being written. However, power supply lines of the SRAM may have large capacitances, even though the outside power supply is switched off, the large capacitances may store charges that prevent the power supply line voltage from dropping any significant amount during the write cycle. Especially when the SRAM speed becomes very fast with a very short write cycle, the floating power supply method may not be very effective in improving a write margin of the SRAM.

As such, what is desired is a SRAM cell power supply system that discharges the power supply lines during a write operation.

SUMMARY

The present disclosure provides a semiconductor memory, which comprises a plurality of memory cells, at least one high voltage power supply (CVDD) line coupled to the plurality of memory cells for supplying power to the same, and at least one controllable discharging circuit coupled between the CVDD line and a complementary low voltage power supply (ground), wherein only during a write operation the controllable discharging circuit is turned on for discharging the CVDD line.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein. It should be noted that the features illustrated in the drawings are not necessarily drawn to scale.

DESCRIPTION

The present invention discloses a write circuit that discharges power supply lines during a write operation.

Figure 1:
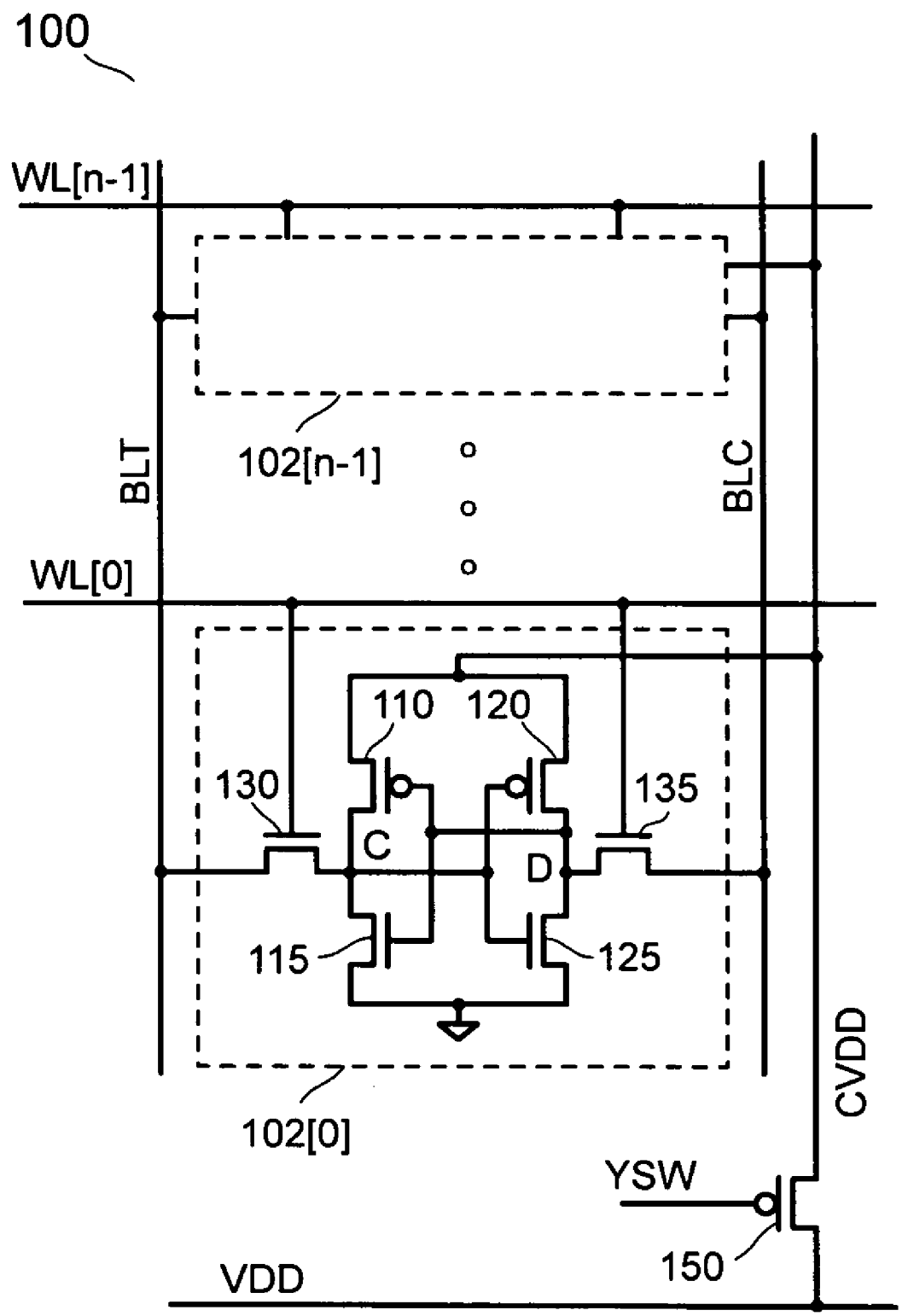
FIG. 1 is a schematic diagram illustrating a SRAM cell column with a power supply switching transistor.

FIG. 1 is a schematic diagram illustrating a SRAM cell column 100 with a power supply switching transistor 150. SRAM cells 102[0:n−1] are conventional 6-T SRAM cells with four transistors 110, 115, 120 and 125 forming two cross-coupled inverters and two pass-gate NMOS transistors 130 and 135 couples the cross-coupled inverters to a bit-line-true (BLT) and a bit-line-complementary (BLC), respectively. Sources of two PMOS transistors 110 and 120 are coupled to a positive voltage power supply (VDD) through the power supply switch 150, which is implemented as a PMOS transistor. A node CVDD on a drain side of the PMOS transistor 150, which is also coupled to the sources of the PMOS transistors 110 and 120, designates a power supply line in the SRAM column 100, which may possess a substantial amount of capacitance if the SRAM column 100 has many cells, i.e., the number n is large. During a write operation, in order to make flipping the cross-coupled inverters easier, a signal YSW is asserted a logic HIGH voltage to turn off the PMOS transistor 150, then the node CVDD is effectively cut off from the VDD or is floating. However, the capacitance on the node CVDD may prevent a voltage at the node CVDD from a significant drop, which in turn may render switching off the VDD less effective in expanding write margins for the SRAM cells 102[0:n−1].

Figure 2:
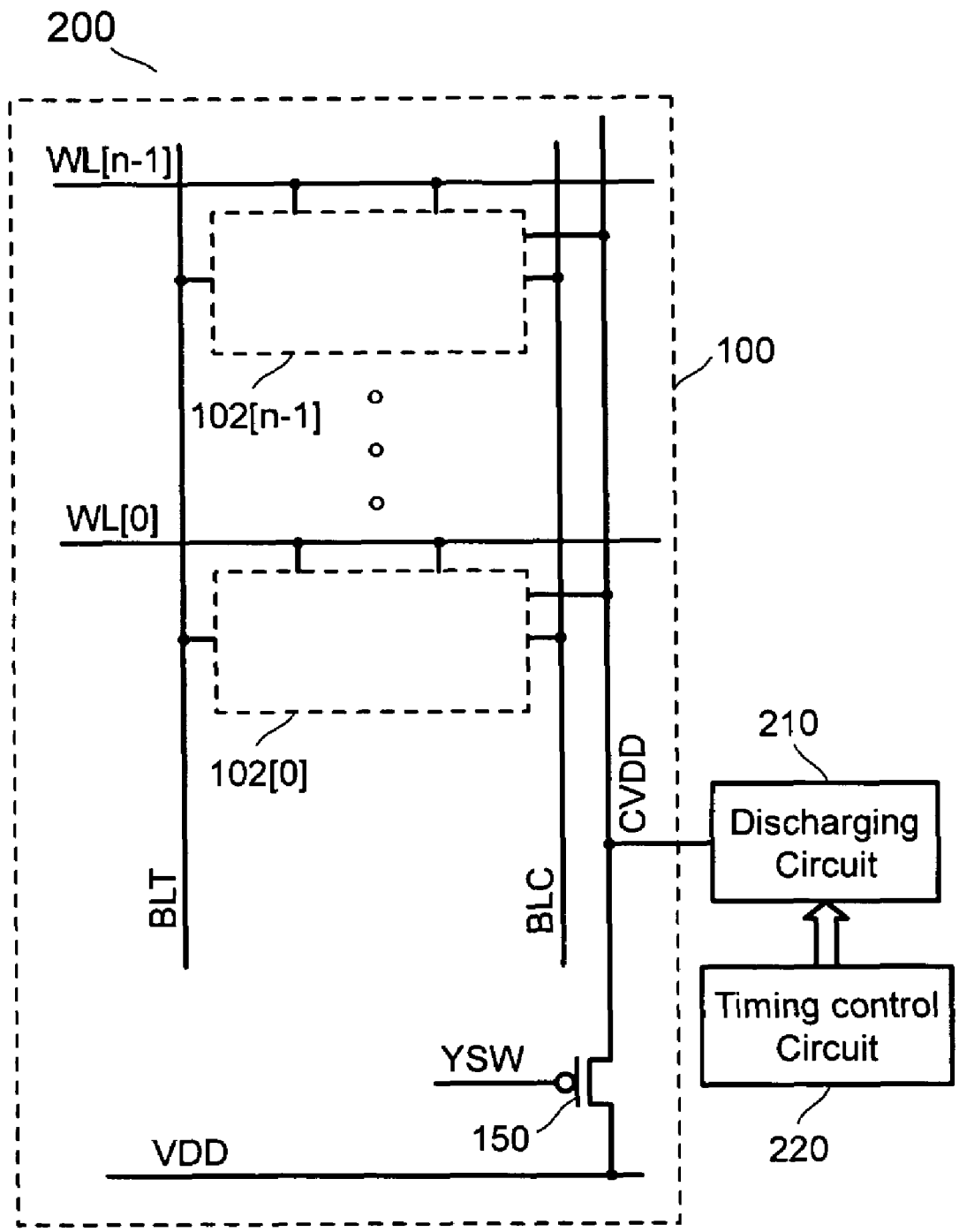
FIG. 2 is a schematic diagram illustrating the SRAM cell column with a power supply line discharging circuits according to an embodiment of the present invention.

FIG. 2 is a schematic diagram illustrating a SRAM cell column 200 with a power supply line discharging circuit 210 according to an embodiment of the present invention. The SRAM cell column 200 is formed by adding the discharging circuit 210 and its timing control circuit 220 to the SRAM cell column 100 shown in FIG. 1, thus identical reference numbers or labels in both FIGS. 1 and 2 designate the same elements.

Referring to FIG. 2, the discharging circuit 210 is coupled to a node CVDD, which designates a power supply line in the SRAM cell column 200. During a write operation, while a signal YSW turns off a power switching PMOS transistor 150, which turns off a conduction of the VDD to the node CVDD, the discharging circuit is also activated which may provide a discharging path between the node CVDD and the ground so that charges stored on the power supply lines, i.e., the node CVDD, can be quickly discharged and allows a voltage at the node CVDD to drop faster than without the discharge path. Dropped voltage at the node CVDD may improve the write margin of the SRAM cells 102[0:n−1]. However, if the node CVDD voltage drops too much, such as to only a half of the VDD, data retention may become an issue for those SRAM cells on the same column but not selected for being written. The timing control circuit 220 is designed to address this issue and others.

Since $\Delta V = \Delta Q/C$, where $\Delta V$ is the voltage drop, $\Delta Q$ is the discharged amount of charges stored at the node CVDD, which has a capacitance of C, and $\Delta Q = \int di/dt$, the longer the discharging time, the larger the $\Delta V$. The timing control circuit 220 is to generate a pulsed control signal with a predetermined duration to activate the discharging circuit 210. The timing of the pulsed control signal may also have to be correlated with the assertion the signal YSW, i.e., the pulsed control signal is activated after the assertion of the signal YSW, and deactivated before the de-assertion of the signal YSW. An overlap between the assertion of the signal YSW and the activation of the discharging circuit 210 creates a short circuit between the VDD and the ground.

Although detailed implementation of the timing control circuit 220 is not shown here, people having skills in the art would have no difficulty to devise a circuit for generating the pulsed control signal which synchronizes with the signal YSW.

Another aspect of the discharging circuit 210 designs involves its uniformity throughout the entire SRAM chip, as each SRAM cell column employs at least one such discharging circuit 210, and it is critical for the node CVDD of very SRAM cell column to drop the same amount of voltage. One way to ensure this uniformity of voltage drop is to design the discharging circuit 210 into providing a constant discharging current throughout the discharging process this will be discussed in implementations of the discharging circuit 210 in the following paragraphs.

Figure 3A:
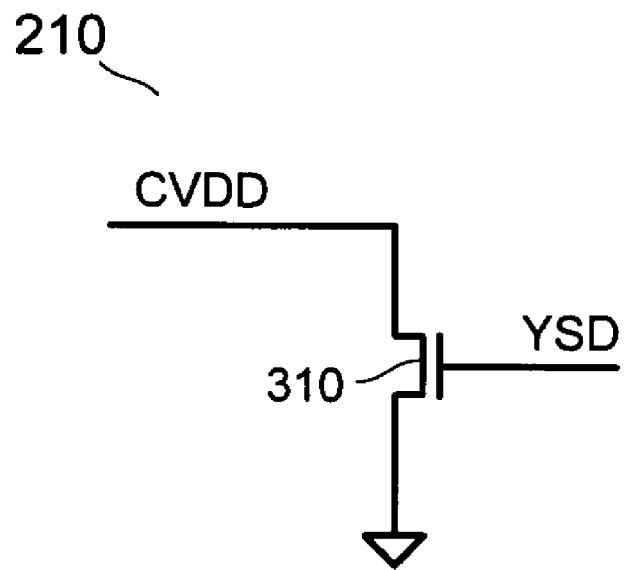
FIGS. 3A and 3B are schematic diagrams illustrating two implementations of the power supply line discharging circuit according to the embodiment of the present invention.
Figure 3B:
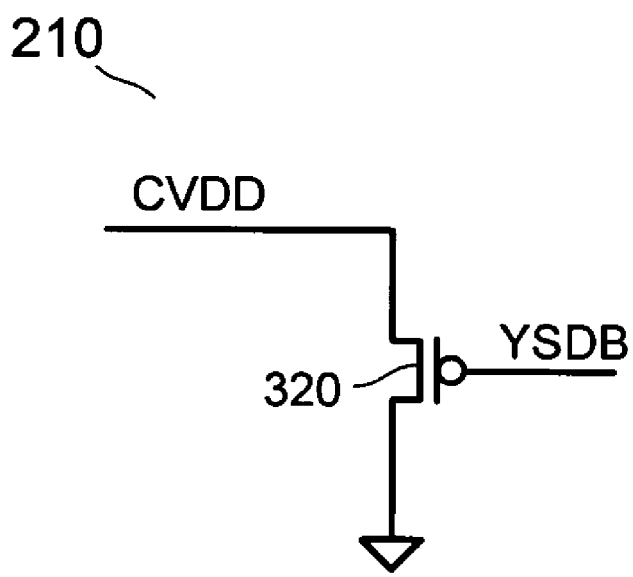

FIGS. 3A and 3B are schematic diagrams illustrating two implementations of the power supply line discharging circuit 210 according to the embodiment of the present invention. Referring to FIG. 3A, the discharging circuit 210 is implemented as a NMOS transistor 310 with a source, gate and drain coupled to the ground, the pulsed control signal YSD and the node CVDD, respectively. When the signal YSD is asserted to a logic HIGH voltage, the NMOS transistor 310 is turned on, and creates a conduction path between the node CVDD and the ground for discharging the node CVDD.

Referring to FIG. 3B, the discharging circuit 210 is implemented as a PMOS transistor 320 with a source, gate and drain coupled to the node CVDD, the pulsed control signal YSD and the ground, respectively. When the signal YSD is asserted to a logic LOW voltage, the PMOS transistor 320 is turned on, and creates a conduction path between the node CVDD and the ground for discharging the node CVDD.

Note that the logic HIGH and low voltages are traditionally equal to the VDD and ground, respectively, and there are no exceptions here. The VDD voltage at the gate of the NMOS transistor 310 ensures it to operate at a saturation region and provides a constant current for discharging the node CVDD. Similarly, the ground voltage at the gate of the PMOS transistor 320 ensures it to also operate at a saturation region and is to provide a constant current for discharging the node CVDD.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor memory comprising:
   a plurality of memory cells;
   at least one high voltage power supply (CVDD) line coupled to the plurality of memory cells for supplying power to the same; and
   at least one controllable discharging circuit coupled between the CVDD line and a complementary low voltage power supply (ground),
   wherein only during a write operation the controllable discharging circuit is turned on for discharging the CVDD line.

2. The semiconductor memory of claim 1, wherein the plurality of memory cells are static random access memory (SRAM) cells.

3. The semiconductor memory of claim 1, wherein the controllable discharging circuit comprises at least one NMOS transistor with a source, drain and gate coupled to the ground, the CVDD line and a control signal, respectively.

4. The semiconductor memory of claim 3, wherein the control signal synchronizes with a write signal, and is activated following an activation of the write signal by a first predetermined time interval and de-activated ahead of the activation of the write signal by a second predetermined time interval.

5. The semiconductor memory of claim 1, wherein the controllable discharging circuit comprises at least one PMOS transistor with a source, drain and gate coupled to the CVDD line, the ground and a control signal, respectively.

6. The semiconductor memory of claim 5, wherein the control signal synchronizes with a write signal, and is activated following an activation of the write signal by a first predetermined time interval and de-activated ahead of the activation of the write signal by a second predetermined time interval.

7. The semiconductor memory of claim 1 further comprising a switching circuit coupled between the CVDD line and a chip level high voltage power supply (VDD), wherein during the write operation the switching circuit shuts off a power supply to the CVDD line by the VDD.

8. The semiconductor memory of claim 7, wherein the switching circuit comprises at least one PMOS transistor with a source, drain and gate coupled to the VDD, the CVDD and a logic control signal, respectively, wherein the logic control signal synchronizes with a write signal.

9. A static random access memory (SRAM) comprising:
   a plurality of SRAM cells;
   at least one high voltage power supply (CVDD) line coupled to the plurality of SRAM cells for supplying power to the same; and
   at least one controllable discharging circuit coupled between the CVDD line and a complementary low voltage power supply (ground),
   wherein only during a write operation the controllable discharging circuit is turned on for discharging the CVDD line.

10. The SRAM of claim 9, wherein the controllable discharging circuit comprises at least one NMOS transistor with a source, drain and gate coupled to the ground, the CVDD line and a control signal, respectively.

11. The SRAM of claim 10, wherein the control signal synchronizes with a write signal, and is activated following an activation of the write signal by a first predetermined time interval and de-activated ahead of the activation of the write signal by a second predetermined time interval.

12. The SRAM of claim 9, wherein the controllable discharging circuit comprises at least one PMOS transistor with a source, drain and gate coupled to the CVDD line, the ground and a control signal, respectively.

13. The SRAM of claim 12, wherein the control signal synchronizes with a write signal, and is activated following an activation of the write signal by a first predetermined time interval and de-activated ahead of the activation of the write signal by a second predetermined time interval.

14. The SRAM of claim 9 further comprising a switching circuit coupled between the CVDD line and a chip level high voltage power supply (VDD), wherein during the write operation the switching circuit shuts off a power supply to the CVDD line by the VDD.

15. The SRAM of claim 14, wherein the switching circuit comprises at least one PMOS transistor with a source, drain and gate coupled to the VDD, the CVDD and a logic control signal, respectively, wherein the logic control signal synchronizes with a write signal.

16. A semiconductor memory comprising:
   a plurality of memory cells;
   at least one high voltage power supply (CVDD) line coupled to the plurality of memory cells for supplying power to the same; and
   at least one NMOS transistor with a source, drain and gate coupled to a complementary low voltage power supply (ground), the CVDD line and a control signal, respectively,
   wherein only during a write operation the NMOS transistor is turned on for discharging the CVDD line.

17. The semiconductor memory of claim 16, wherein the plurality of memory cells are static random access memory (SRAM) cells.

18. The semiconductor memory of claim 16, wherein the control signal synchronizes with a write signal, and is activated following an activation of the write signal by a first predetermined time interval and de-activated ahead of the activation of the write signal by a second predetermined time interval.

19. The semiconductor memory of claim 16 further comprising a switching circuit coupled between the CVDD line and a chip level high voltage power supply (VDD), wherein during the write operation the switching circuit shuts off a power supply to the CVDD line by the VDD.

20. The semiconductor memory of claim 19, wherein the switching circuit comprises at least one PMOS transistor with a source, drain and gate coupled to the VDD, the CVDD and a logic control signal, respectively, wherein the logic control signal synchronizes with a write signal.

* * * * *